(12) United States Patent (10) Patent No.: US 8,148,739 B2
Lan et al. (45) Date of Patent: Apr. 3, 2012

(54) LED PACKAGE STRUCTURE

(75) Inventors: Pei-Hsuan Lan, Banciao (TW);
Yu-Bing Lan, Banciao (TW)

(73) Assignee: Forward Electronics Co., Ltd. (TW)

( * ) Notice: Subject to any disclaimer, the term of this patent is extended or adjusted under 35 U.S.C. 154(b) by 143 days.

(21) Appl. No.: 12/662,819

(22) Filed: May 5, 2010

(65) Prior Publication Data
US 2011/0121328 A1    May 26, 2011

(30) Foreign Application Priority Data
Nov. 26, 2009   (TW) ................. 98222141 U

(51) Int. Cl.
*H01L 33/00* (2010.01)
(52) U.S. Cl. ....... 257/88; 257/98; 257/99; 257/E21.352; 257/E21.134; 257/E21.189; 257/E33.061; 257/E33.075
(58) Field of Classification Search ............ 257/88, 257/98, 99, 104, 127, E21.134, 189, 351, 257/E33.061, E21.189, E21.352
See application file for complete search history.

(56) References Cited

U.S. PATENT DOCUMENTS

| | | | |
|---|---|---|---|
| 7,072,096 B2 * | 7/2006 | Holman et al. | 359/298 |
| 7,482,636 B2 * | 1/2009 | Murayama et al. | 257/98 |
| 7,921,853 B2 * | 4/2011 | Fiset | 128/898 |
| 7,952,107 B2 * | 5/2011 | Daniels et al. | 257/80 |

* cited by examiner

*Primary Examiner* — David Nhu
(74) *Attorney, Agent, or Firm* — Bacon & Thomas, PLLC

(57) ABSTRACT

An LED package structure includes a heatsink slug, a positive-electrode frame, a negative-electrode frame, and an LED module electrically connected with the positive-electrode frame and the negative-electrode frame. The LED module includes a plurality of LED chips. The heatsink slug is provided, at its surface, with a plurality of cup-like recesses. The plural LED chips are each bonded, correspondingly, on a plane in the cup-like recess. Each of the LED chips is covered with a fluorescent colloidal layer having a curved and convex contour. As a result, a specific proportion for the color lights emitted from all the LED chips and from the fluorescent material in every direction of a space can be maintained, and that a better spatial color uniformity can be achieved.

7 Claims, 3 Drawing Sheets

LED PACKAGE STRUCTURE

BACKGROUND OF THE INVENTION

1. Field of the Invention

The present invention relates to a light emitting diode (LED), and more particularly, to an LED package structure having plural LED chips so that a better spatial color uniformity can be obtained and claims benefit of Taiwan 098222141 filed Nov. 26, 2009.

2. Description of Related Art

Referring to FIG. 1, a cross-sectional view illustrating a conventional LED package structure, the LED package structure comprises a heatsink slug 1, a positive-electrode frame 2, a negative-electrode frame 3, and an LED module 4. The heatsink slug 1 is, at its top, formed with a cup-like recess 5 for bonding the LED module 4, where a plane for loading the LED module 4 is referred to as a "die-bonding plane 6." The LED module 4 may be a single or plural electrically-connected LED chips, which, through two gold wires (not shown), can be electrically connected with the positive-electrode frame 2 and the negative-electrode frame 3.

There is a fluorescent colloidal layer 7 covering on the LED module 4, and that an insulating frame 8 envelopes and fixes part of the heatsink slug 1 and of the frames 2,3.

Taking a widely-applied LED as an example, the LED module 4 may be a blue-light LED chip, and that the fluorescent colloidal layer 7 may be a yellow fluorescent colloidal layer contained yellow phosphor (not shown). The theory for its function resides in using a short-wavelength blue-light to excite the fluorescent powder for emitting a longer-wavelength yellow light, which then are mixed into a white light due to complement of colors.

However, there is a potential problem in the above-mentioned conventional LED package structure, namely, when an LED chip and a fluorescent powder emit lights of different colors which are distributed non-uniformly, then a phenomenon of color variation will occur where colors are non-uniform. Since the LED chip relates to an extended plane light source, a normal-direction component of blue light (as shown by arrow P) is greater than the components of other directions. This makes it necessary for the fluorescent colloidal layer 7 covering on the normal-direction component thicker than the components of other directions, so that a better spatial color uniformity can be obtained. The method for this achievement resides in applying the theory of surface tension such that when a silicone gel is formed on the LED chip (volume-dispensing method), a curved and convex gel surface can be formed.

Nevertheless, in case a dimension of the cup-like recess 5 becomes greater to a certain extent (for example, in an occasion where plural LED chips are received therein), the known volume-dispensing method can hardly form an ideal curved and convex contour on the fluorescent colloidal layer 7, but rather a slightly curved surface. Under such circumstances, the fluorescent colloidal layer 7 covering on the normal-direction component, instead, becomes thinner than the components of other directions. This will result in a great amount of normal-direction blue light penetrating the fluorescent colloidal layer 7. Therefore, a higher color temperature occurs in the normal direction, while a lower color temperature at two sides and surroundings, and as such, a tint phenomenon is produced.

SUMMARY OF THE INVENTION

An object of the present invention is to provide an LED package structure, comprising a heatsink slug, a positive-electrode frame, a negative-electrode frame, and an LED module. The LED module is electrically connected with the positive-electrode frame and the negative-electrode frame, respectively, and includes a plurality of LED chips.

Further, the heatsink slug is provided, at its surface, with a plurality of cup-like recesses, where the plural LED chips are each bonded, correspondingly, on a plane in the cup-like recess. Besides, each of the LED chips is covered with a fluorescent colloidal layer having a curved and convex contour.

Through the above-mentioned structure, the LED chips are each arranged in an independent cup-like recess, where the cup-like recess, being independent and having a smaller dimension at its opening, can make the fluorescent colloidal layer, which is located above the LED chip, form a curved and convex contour due to surface tension. This indicates that the fluorescent colloidal layer has a greater covering thickness in the normal direction. As a result, the LED chip will have a lowered-proportion color light in its normal-direction component, while the different color light in every direction (i.e. the color lights emitted from the LED chips and from the fluorescent colloidal layer) will maintain a specific proportion. A better spatial color uniformity can, therefore, be achieved.

The plural LED chips may have at least two emission wavelengths or have the same emission wavelength. The LED chips may be of blue-light LED chips, green-light LED chips, red-light LED chips, or ultraviolet LED chips.

According to the present invention, the heatsink slug may be of metallic heatsink slug, such as a copper heatsink slug. The cup-like recess may be formed rectangular. The LED package structure, according to the present invention, may further comprise an insulating body enveloping and fixing part of the heatsink slug, of the positive-electrode frame, and of the negative-electrode frame.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
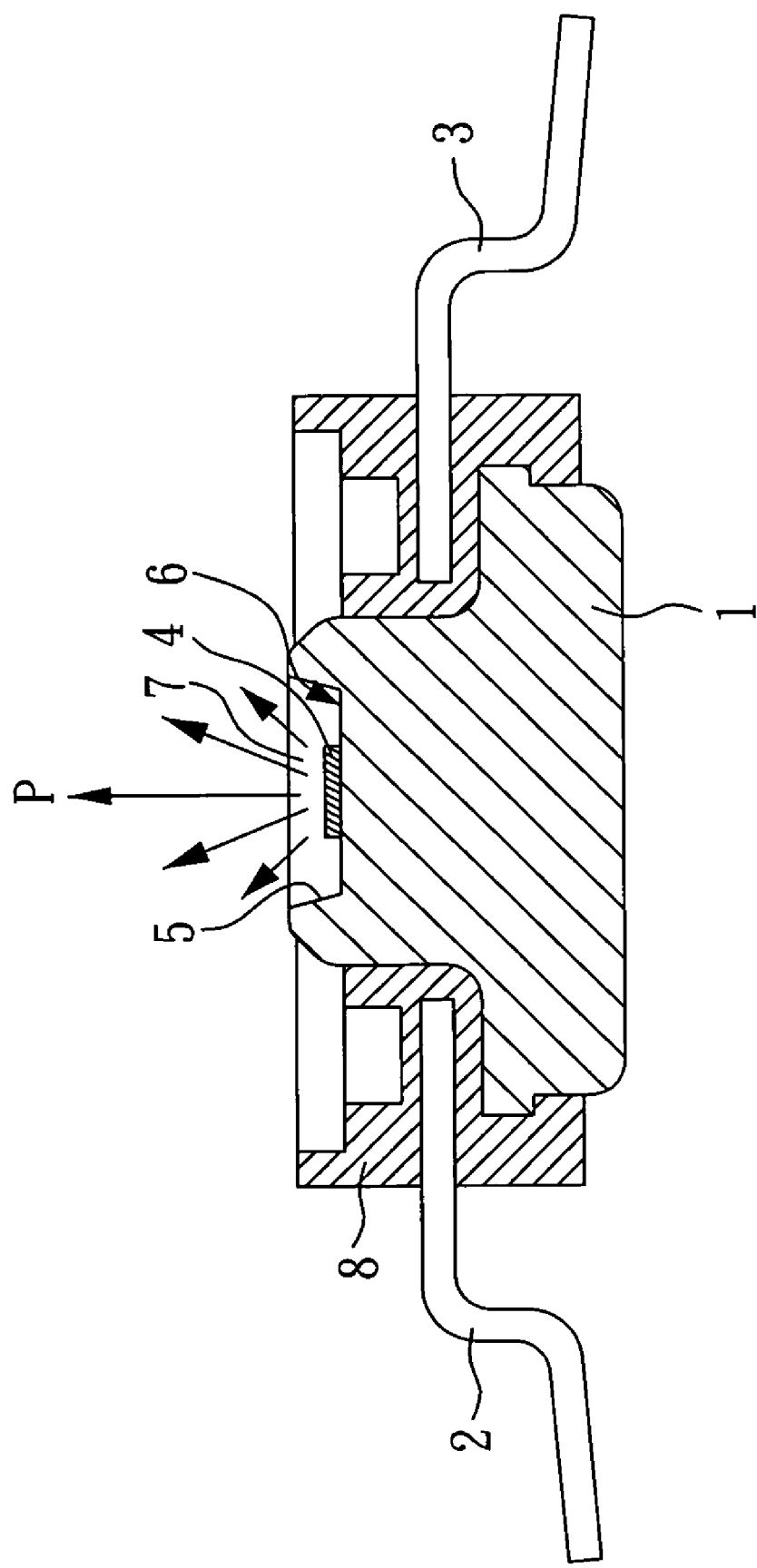
FIG. 1 is a cross-sectional view illustrating a conventional LED package structure.
Figure 2:
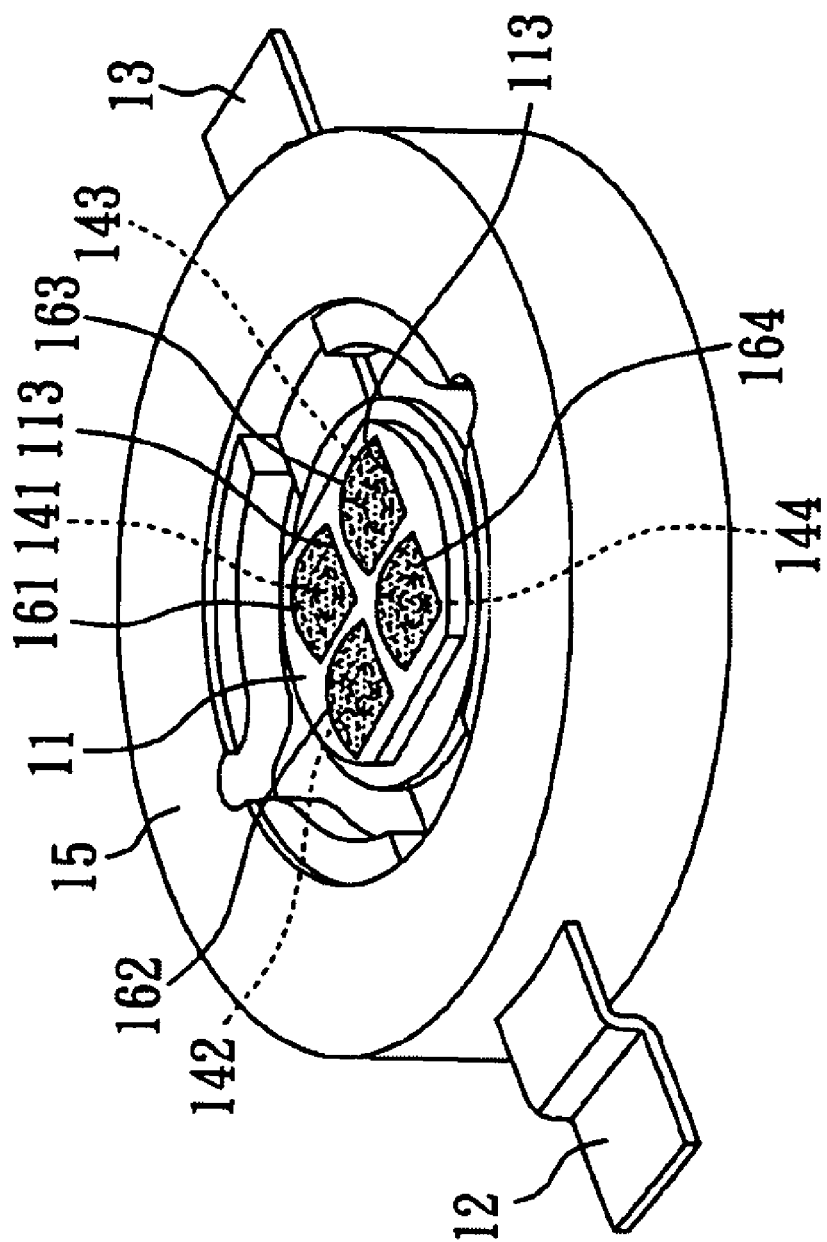
FIG. 2 is a perspective view illustrating an LED package structure according to the present invention.
Figure 3:
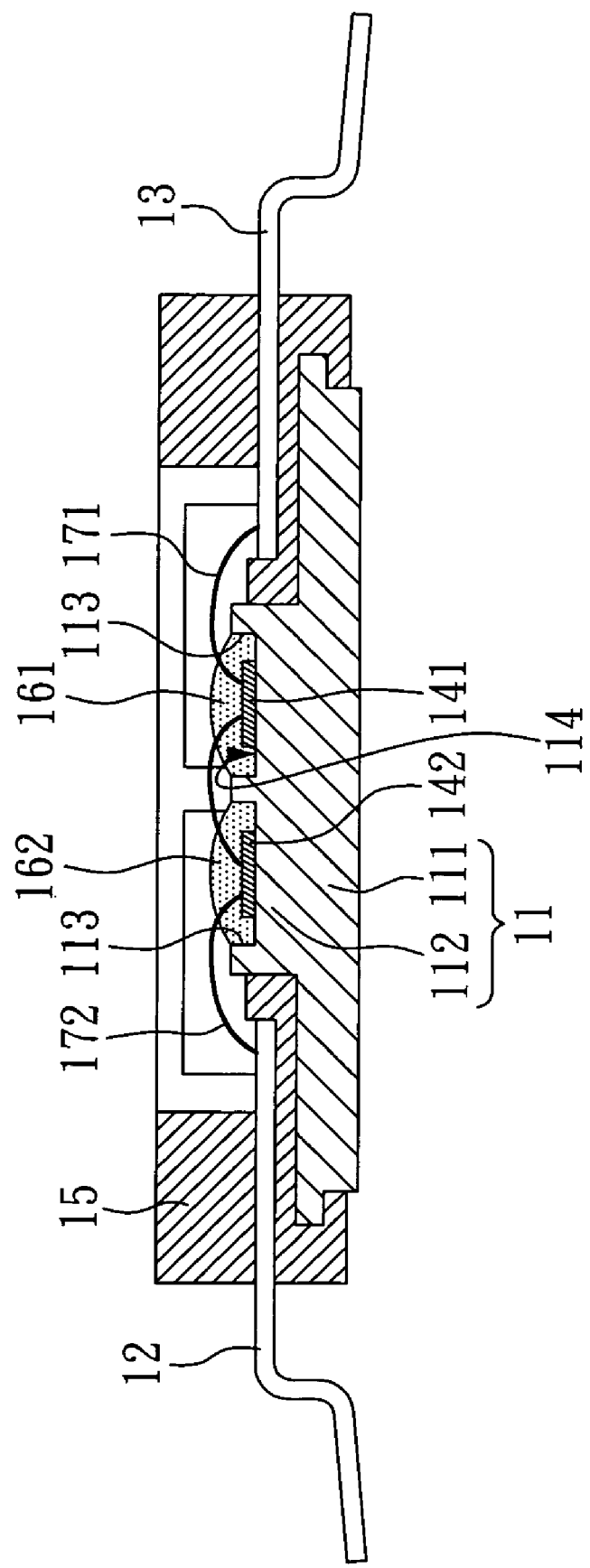
FIG. 3 is a cross-sectional view illustrating the LED package structure according to the present invention.

Referring to FIG. 2, a perspective view illustrating an LED package structure according to the present invention, and to FIG. 3, a cross-sectional view illustrating the LED package structure, the LED package structure comprises a heatsink slug 11, a positive-electrode frame 12, a negative-electrode frame 13, an LED module, and an insulating body 15. The heatsink slug 11 has a convex configuration, and includes a base 111 and a protrusion 112 extending upward from the base 111, wherein the protrusion 112, at its surface, is provided with a plurality of cup-like recesses 113. In the present invention, as exemplified, there are four cup-like recesses 113 each of which is formed rectangular.

Further, according to the present invention, the LED module includes, for example, four electrically-connected LED chips 141 to 144, wherein the two LED chips 141,142 are, through two gold lines 171,172, electrically connected with the negative-electrode frame 13 and the positive-electrode frame 12. The positive-electrode frame 12 and the negative-electrode frame 13 are then connected, respectively, with an outside circuit (not shown) for providing a power necessary for operation and control of the LED chips 141 to 144.

The LED chips 141 to 144 are each fixed on a chip-bonding plane 114 in a corresponding cup-like recess 113. The heatsink slug 11 is made of, for example, copper, iron or other metal or alloy having a preferable thermal conductivity. Since the LED chips 141 to 144 are fixed directly on metallic material (generally having a good thermal conductivity), the heat produced from operation can be dispersed, through the chip-bonding planes 114, to surroundings outside of the heatsink slug 11 so as to avoid any adverse influence to luminous efficiency of LED devices due to heat accumulated inside of the LED chips 141 to 144.

Each of the LED chips 141 to 144 is covered with a fluorescent colloidal layer 161 to 164. In the present invention, the LED chips 141 to 144 are blue-LEDs, and that the fluorescent colloidal layers 161 to 164 relate to yellow phosphor layers.

The insulating body 15 surrounds the heatsink slug 11, and envelops part of the heatsink slug 11, of the positive-electrode frame 12, and of the negative-electrode frame 13, such that the three can be integrated as a unit. Part of the base 111 of the heatsink slug 11 exposes out of the insulating body 15.

Given the above, it is understood that since the LED chips 141 to 144 are each bonded in an independent cup-like recess 113, dimension of the cup-like recess 113 can be controlled appropriately. This is because the independent cup-like recess 113, as compared with a cup-like recess receiving plural LED chips, has a smaller dimension at its opening. Therefore, the volume-dispensing method can be easily applied to form the fluorescent colloidal layers 161-164, each of which has a curved and convex contour, so as to maintain a greater thickness for the fluorescent colloidal layers 161-164 in a normal direction. As a result, a specific proportion for blue light and yellow light in every direction can be maintained, and that the lights of different colors emitting from the LED chips 141 to 144 and the fluorescent colloidal layers 161-164 tend to be distributed uniformly. Eventually, the LED device can have an improved illumination of spatial color uniformity.

Of course, although in the present invention, the LED chips are exemplified as having the same color, LED chips of multiple colors can also be adopted, for example, a combination of blue-light, red-light, and green-light LEDs.

Further, the LED chips can be of DC LED chips or AC LED chips.

Although the present invention has been explained in relation to its preferred embodiments, it is to be understood that many other possible modifications and variations can be made without departing from the scope of the invention as hereinafter claimed.

What is claimed is:

1. An LED package structure, comprising:
   a heatsink slug;
   a positive-electrode frame;
   a negative-electrode frame; and
   an LED module, being electrically connected with the positive-electrode frame and the negative-electrode frame;
   characterized in that:
   the LED module includes a plurality of LED chips, and the heatsink slug is provided, at its surface, with a plurality of cup-like recesses, where the plurality of LED chips are each bonded, correspondingly, on a plane in the plurality of cup-like recess, and each of the LED chips is covered with a fluorescent colloidal layer having a curved and convex configuration.

2. The LED package structure as claimed in claim 1, wherein the plurality of LED chips have at least two emission wavelengths.

3. The LED package structure as claimed in claim 1, wherein the plurality of LED chips have the same emission wavelengths.

4. The LED package structure as claimed in claim 1, wherein the plurality of LED chips include at least one blue-light LED chip.

5. The LED package structure as claimed in claim 1, further comprising an insulating body enveloping part of the heatsink slug, of the positive-electrode frame, and of the negative-electrode frame.

6. The LED package structure as claimed in claim 1, wherein the heatsink slug is a metallic heatsink slug.

7. The LED package structure as claimed in claim 1, wherein the plurality of cup-like recess is formed rectangular.

* * * * *